United States Patent [19]

Itoh

[11] Patent Number: 5,228,567
[45] Date of Patent: Jul. 20, 1993

[54] WRAPPING SHEET FOR ELECTRONIC PARTS

[76] Inventor: Shinji Itoh, 7-12, Matsunoki 4-chome, Kuwana-shi, Mie-ken, Japan

[21] Appl. No.: 925,788

[22] Filed: Aug. 7, 1992

[51] Int. Cl.$^5$ .................. B65D 73/02; H05K 9/00
[52] U.S. Cl. .................. 206/328; 206/204; 206/334; 361/220; 361/424; 428/411.1
[58] Field of Search .......... 174/35 R, 51, 52.3; 206/328, 334, 312, 204, 484.1, 484.2, 521, 524.3; 428/34.2, 34.6, 34.7, 36.5, 36.6, 212, 411.1, 414, 922, 924; 361/212, 216, 218, 220, 331, 380, 392, 398, 417, 419, 420, 424

[56] References Cited

U.S. PATENT DOCUMENTS

| | | | |
|---|---|---|---|
| 3,572,499 | 3/1971 | Mondano | 206/1 |
| 4,160,503 | 7/1979 | Ohlbach | 206/328 |
| 4,557,379 | 12/1985 | Lane | 206/328 |
| 5,009,318 | 4/1991 | Lepinoy | 206/524.8 |
| 5,142,100 | 8/1992 | Vaupotic | 174/34 |

*Primary Examiner*—Gerald P. Tolin
*Attorney, Agent, or Firm*—Dennison, Meserole, Pollack & Scheiner

[57] ABSTRACT

A wrapping sheet is provided to keep electronic parts in an excellent dry condition and let static electricity caused by the friction of materials release to the outside. The wrapping sheet for enveloping electronic parts comprises an air permeable sheet at one side, an air non-permeable sheet with a conductive layer on the other side, separate pouchy portions formed between both the sheets, and silica gel and conductive foam beads enclosed in each separate pouchy portion.

2 Claims, 4 Drawing Sheets

WRAPPING SHEET FOR ELECTRONIC PARTS

BACKGROUND OF THE INVENTION

1. Field of the Invention

This invention relates to a wrapping sheet for enveloping liquid crystal parts, electronic parts such as IC, LSI and VLSI, and other precision parts.

2. Description of the Prior Art

In case of storing and transporting electronic parts such as IC and LSI, water can attach to the electronic parts or moisture can soak into them under the dew point, and as a result the electric leak arises in the electronic parts or the conduction defect, disconnection and other error functioning occur in them due to the corrosion of the parts. For that reason the electronic parts must be stored and transported in the dry condition, so that until now desiccant has been used to keep them in the dry condition. However, when the particles of desiccant or the sheets of plastic material for enclosing the desiccant rub mutually during the transportation, such friction generates static electricity. The amount of the static electricity is increased especially, because the humidity is lowered with the desiccant. Since MOS type IC has the extremely thin oxide film for insulating its gate electrode, the discharge of the generated static electricity destroyed the insulation, and it was a problem that the semiconductors of the IC were affected adversely.

SUMMARY OF THE INVENTION

Accordingly, an object of the present invention is to provide a wrapping sheet for electronic parts which is capable of keeping the electronic parts in an excellent dry condition and at the same time favorably resolving the bad influence on the electronic parts due to the static electricity generated increasingly in that dry condition.

The foregoing object of the present invention is accomplished by providing a wrapping sheet for electronic parts comprising an air permeable sheet on one side, an air non-permeable sheet with a conductive layer on the other side, separate pouchy portions between both the sheets, and silica gel and conductive foam beads enclosed in each separate pouchy portion. The object is also accomplished by providing a wrapping sheet described above wherein a transparent portion is formed on said non-permeable sheet in each separate pouchy portion.

The wrapping sheet is capable of removing the moisture around the electronic parts favorably with the silica gel enclosed in the separate pouchy portions. Also the wrapping sheet is capable of favorably protecting the electronic parts owing to its high shielding effect against the static electricity. This effect results from the fact that the static electricity generated due to the friction of the silica gel and so on is released through the conductive form beads to the outside non-permeable sheet, which also releases the static electricity outside through its conductive layer. In addition, the cushiony effect of the form beads can prevent effectively the silica gel from being crushed and can protect the electronic parts from the outer shock favorably.

The transparent portion formed on the non-permeable sheet in the separate pouchy portion makes it possible to check the water absorbing capacity of the inner silica gel from the outside therethrough.

DESCRIPTION OF THE DRAWINGS

The object and features of the invention may be understood with reference to the following detailed description of an illustrative embodiment of the invention, taken together with the accompanying drawings in which.

DESCRIPTION OF THE PREFERRED EMBODIMENT

The embodiment of this invention will be explained on the bases of the drawings hereinafter.

Figure 1:
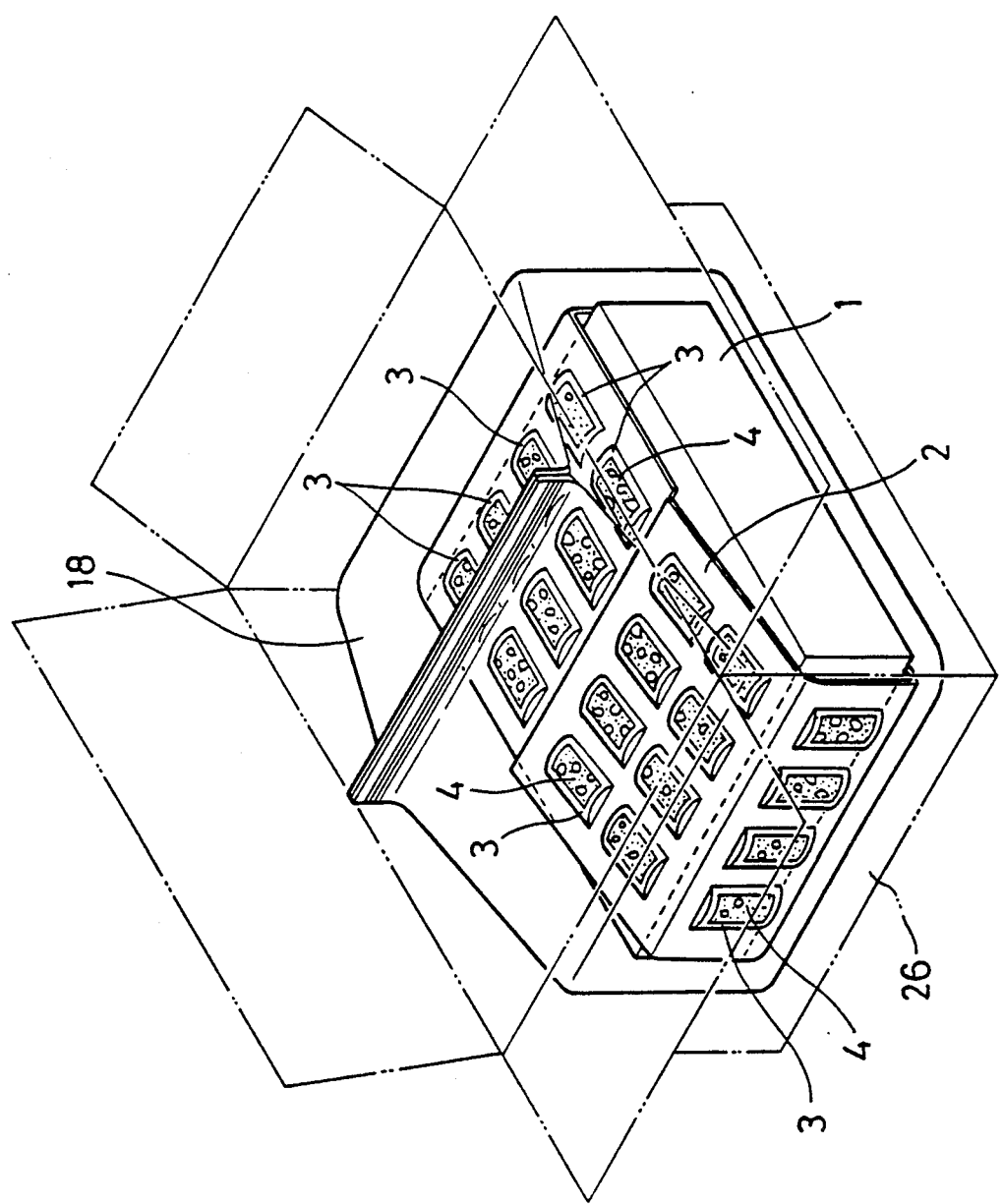
FIG. 1 is a perspective, constitutional view of a wrapping sheet for enveloping electronic parts.

FIG. 1 is a perspective view of a wrapping sheet for enveloping electronic parts.

An electronic parts 1, which is a substrate installed with IC, LSI and so on, is first enveloped by the wrapping sheet 2 around its outer surface, kept airtight in an airtight bag 18, and then, packed in the outer box 26, stored and transported.

Figure 2:
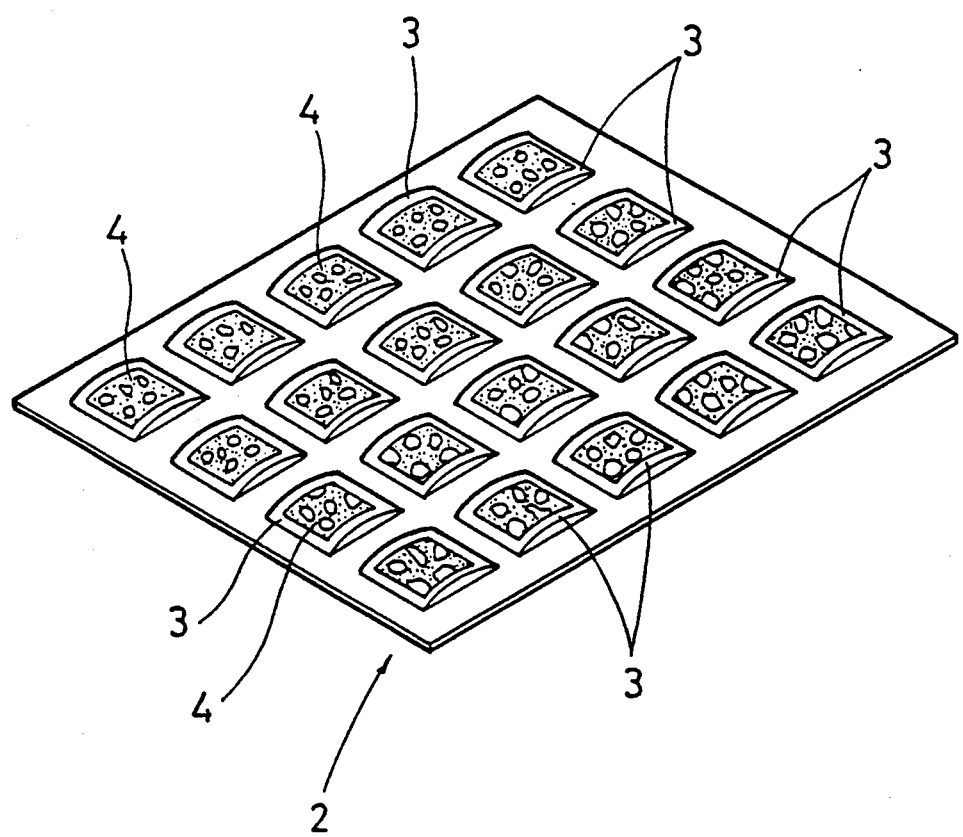
FIG. 2 is a development view of the wrapping sheet.

The wrapping sheet 2, as shown in FIG. 2, consists of sheets which form a plurality of separate pouchy portions 3, 3, 3 at predetermined intervals. Each separate pouchy portion 3 encloses silica gel 15 and foam beads 16 to be mentioned later.

Figure 3:
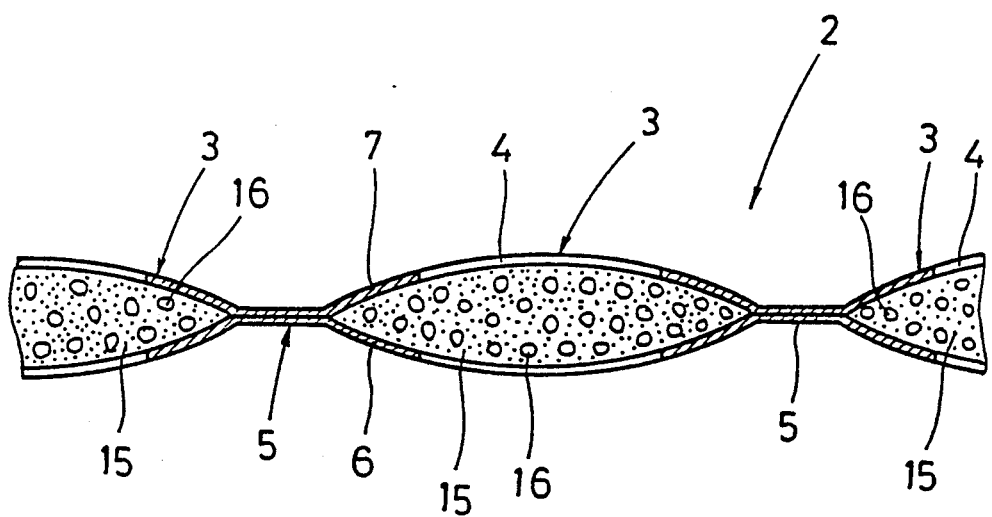
FIG. 3 is an enlarged sectional view of the wrapping sheet illustrated in FIG. 2.

FIG. 3 is a sectional view of a principal portion of the wrapping sheet 2. The said separate pouchy portion 3 is partitioned off from the sheet, pouched and formed by the seal portion 5 made up by heat-sealing an inner sheet 6 and an outer sheet 7. Before making up the seal portion 5, the silica gel 15 and the foam beads 16 are enclosed in each separate pouchy portion 3.

Incidentally, the foam beads 16 can be either foamed in the separate pouchy portion 3 by heating after enclosed therein or can be foamed beforehand and enclosed in the separate pouchy portion 3.

And the inner sheet 6 is formed with an air permeable film and the outer sheet 7 is formed with an air non-permeable film.

Figure 4:
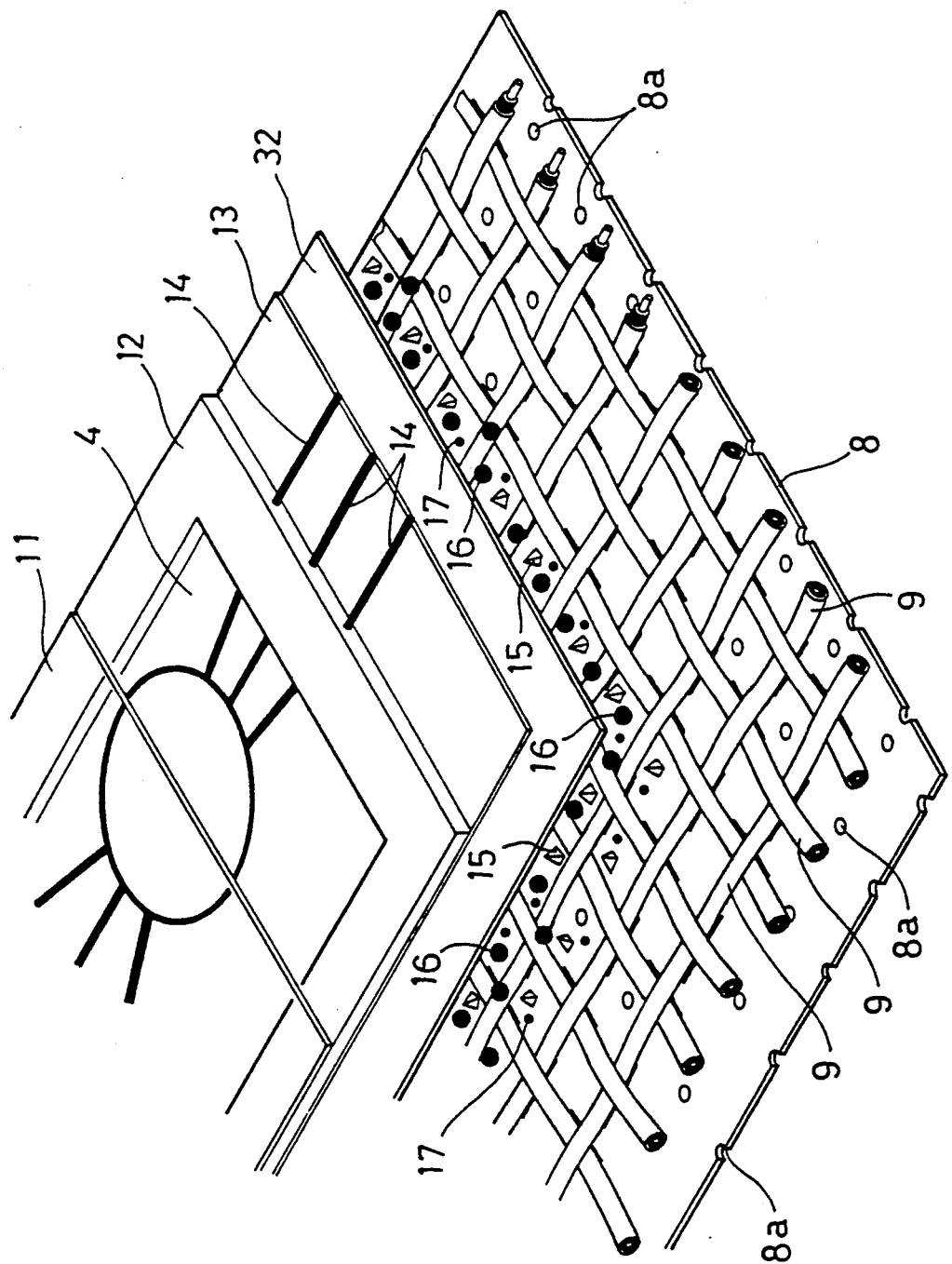
FIG. 4 is an enlarged constitutional view of a principal part of the wrapping sheet.

The details of each part is shown in FIG. 4, an enlarged outlined, constitutional view. The said inner sheet 6 consists of an inner film 8 and an inner nonwoven fabric 9. On the other hand, the said outer sheet 7 consists of the four layers, that is, a charge-preventive guard layer 11, an evaporated metal layer 12, an insulator layer 13 and an adhesive layer 32.

Further, the inner film 8 has a structure in which there are formed a lot of through holes 8a, 8a with the size of 1-2 $\mu$ so that gas and vapor can be passed through but liquid such as water cannot.

Next, each layer of the said outer sheet 7 will be explained. The charge-preventive guard layer 11 in the outermost side is kneaded or coated with polyamide or polyimide. The metal steam-welded layer 12 in the second outermost side is mixed with metal powder such as carbon black, Cu, Ni, Ag and Al. The insulator layer 13 on the third layer consists of a polyester film mixed with mica powder. The adhesive layer 32 in the innermost side consists of polyethylene kneaded with polyamide or polyimide.

Further, a transparent portion 4 is formed in part of the outer sheet 7 by means of the punching process so as to be capable of observing the inside of the separate pouchy portion 3. In the transparent portion 4, letters such as a name of goods are written down in a conductive ink 14 in which powder such as carbon black or silver powder is mixed.

Furthermore, particles of a water absorbing polymer 17 may be enclosed in the said separate pouchy portion 3b in addition to the silica gel 15. This water absorbing polymer 17 can assist the absorbing capacity of the silica gel 15 by absorbing a large quantity of water in case that the humidity becomes extremely high in the surroundings after reaching the dew point.

The foam beads 16 which are enclosed in the separate pouchy portion 3 together with the silica gel 15 consist of polystyrene or polyethylene in which black carbon is mixed. The foam beads 16 have cushioning property after foaming process and can efficiently prevent the particles of silica gel 15 from rubbing mutually and breaking down. Further, in case that static electricity occurs due to the friction of the silica gel 15 at the time of enclosing them in the separate pouchy portion 3, the foam beads 16 can release static electricity through the inner black carbon to the outside. The foam beads 16 are also capable of protecting the electronic parts 1 from the outer shock by displaying their cushioning capacity.

The electronic parts 1 can be kept in a dry condition by enveloping it with the wrapping sheet 2 of this invention because the silica gel 15 and the water absorbing polymer 17 can efficiently absorb the moisture around the electronic parts 1. And the electronic parts 1 are never affected by static electricity because static electricity caused by the friction of the silica gel 15 and so on can be released through the foam beads 16, the adhesive layer 32, the evaporated metal layer 12 and the charge-preventive guard layer 11.

Further, the electronic parts 1 is never affected by microwave because outer microwave is efficiently shut out by the insulator layer 13.

What is claimed is:

1. A wrapping sheet for enveloping an electronic part comprising an air permeable sheet at one side, an air non-permeable sheet with a conductive layer on the other side, separate pouchy portions formed between both the sheets, and silica gel and conductive foam beads enclosed in each separate pouchy portion.

2. A wrapping sheet according to claim 1 wherein a transparent portion is formed in part of said air non-permeable sheet so as to be capable of observing the inside of said separate pouchy portion.

* * * * *